United States Patent
Oomori et al.

(10) Patent No.: US 11,228,159 B2
(45) Date of Patent: Jan. 18, 2022

(54) SEMICONDUCTOR LASER DEVICE

(71) Applicant: Panasonic Intellectual Property Management Co., Ltd., Osaka (JP)

(72) Inventors: Kouji Oomori, Shiga (JP); Kouki Tsumura, Shiga (JP); Teruaki Kasai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 264 days.

(21) Appl. No.: 16/726,294

(22) Filed: Dec. 24, 2019

(65) Prior Publication Data

US 2020/0136344 A1 Apr. 30, 2020

Related U.S. Application Data (63) Continuation of application No. PCT/JP2018/024535, filed on Jun. 28, 2018.

(30) Foreign Application Priority Data

Jul. 7, 2017 (JP) .............................. JP2017-133759

(51) Int. Cl.
*H01S 5/024* (2006.01)
*H01L 23/36* (2006.01)
(Continued)

(52) U.S. Cl.
CPC .......... *H01S 5/02476* (2013.01); *H01L 23/36* (2013.01); *H01S 5/023* (2021.01); *H01S 5/0233* (2021.01); *H01S 5/0235* (2021.01)

(58) Field of Classification Search
CPC .... H01S 5/02476; H01S 5/023; H01S 5/0233; H01S 5/0235; H01S 5/02345;
(Continued)

(56) References Cited

U.S. PATENT DOCUMENTS 6,097,744 A * 8/2000 Takigawa ................ H01S 5/024
372/34
6,970,485 B1 11/2005 Kitayama et al.
(Continued)

FOREIGN PATENT DOCUMENTS

JP 2005-268305 9/2005
JP 2005-268650 9/2005
(Continued)

OTHER PUBLICATIONS

Extended European Search Report dated Jun. 16, 2020 in corresponding European Patent Application No. 18828042.4.
(Continued)

*Primary Examiner* — Xinning(Tom) Niu
(74) *Attorney, Agent, or Firm* — Wenderoth, Lind & Ponack, L.L.P.

(57) ABSTRACT

A semiconductor laser device includes first heat radiator (10) having first flow path (11) and second flow path (12) inside to allow a flow of a refrigerant and second heat radiator (20) put in contact with an upper surface of the first heat radiator. The first flow path and the second flow path are independent of each other. The second heat radiator includes an insulating member that internally has third flow path (23) communicating with first flow path (11). The semiconductor laser device further includes lower electrode block (60) disposed on a portion of an upper surface of the second heat radiator, submount (30) being made of a conductive material and being disposed on a remainder of the upper surface of second heat radiator (20), semiconductor laser element (40) disposed on an upper surface of submount (30), and upper electrode block (61) disposed such that submount (30) and semiconductor laser element (40) are clamped between the upper electrode block and second heat radiator (20). Second
(Continued)

flow path (12) is formed below a zone for the disposition of lower electrode block (60).

9 Claims, 7 Drawing Sheets

(51) Int. Cl.
*H01S 5/023* (2021.01)
*H01S 5/0233* (2021.01)
*H01S 5/0235* (2021.01)

(58) Field of Classification Search
CPC .. H01S 5/0237; H01S 5/4025; H01S 5/02492; H01S 5/02423; H01L 23/36; H01L 23/473
See application file for complete search history.

(56) References Cited

U.S. PATENT DOCUMENTS

| | | | | |
|---|---|---|---|---|
| 2001/0004370 A1* | 6/2001 | Miyajima | ............ | H01S 5/4031 372/36 |
| 2004/0057479 A1* | 3/2004 | Stephens, IV | ........ | H01S 5/0237 372/36 |
| 2006/0054906 A1 | 3/2006 | Inoue et al. | | |
| 2006/0262819 A1* | 11/2006 | Treusch | .............. | H01S 5/02423 372/34 |
| 2008/0095204 A1* | 4/2008 | Miyajima | ............. | H01S 5/4025 372/35 |
| 2017/0301604 A1 | 10/2017 | Ueda et al. | | |
| 2019/0036300 A1 | 1/2019 | Ueda et al. | | |

FOREIGN PATENT DOCUMENTS

| | | |
|---|---|---|
| JP | 2007-048909 | 2/2007 |
| JP | 3951919 B | 8/2007 |
| JP | 2008-172141 | 7/2008 |
| WO | 2016/103536 | 6/2016 |
| WO | 2017/183300 | 10/2017 |

OTHER PUBLICATIONS

International Search Report of PCT application No. PCT/JP2018/024535 dated Sep. 11, 2018.

* cited by examiner

SEMICONDUCTOR LASER DEVICE

This application is a continuation of the PCT International Application No. PCT/JP2018/024535 filed on Jun. 28, 2018, which claims the benefit of foreign priority of Japanese patent application No. 2017-133759 filed on Jul. 7, 2017, the contents all of which are incorporated herein by reference.

TECHNICAL FIELD

A technique disclosed herein relates to a semiconductor laser device.

BACKGROUND ART

In recent years, demand for metal working using laser light has been growing. Laser devices with higher output have been required, and semiconductor laser devices that include semiconductor laser elements with high light-electricity conversion efficiency have received attention. However, along with an increase in power output from a semiconductor laser device, the amount of electricity flowing through a semiconductor laser element rises. This can lead to a rise in temperature of the semiconductor laser element due to Joule heat, resulting in lowered performance, deterioration of the element, and other faults.

Against this backdrop, conventional art (for example, see PTLs 1 and 2) presents a structure for cooling a semiconductor laser element. The cooling structure is a flow path formed inside a heat sink on which the semiconductor laser element and a submount are disposed to allow a flow of cooling water.

CITATION LIST

Patent Literature

PTL 1: Unexamined Japanese Patent Publication No. 2008-172141

PTL 2: Japanese Patent No. 3951919

SUMMARY OF THE INVENTION

Technical Problem

Unfortunately, in the conventional structure described above, the cooling water cools the submount and a lower side of the semiconductor laser element mounted on the submount and it is difficult to cool an upper side of the semiconductor laser element.

The technique disclosed herein has been accomplished in view of the problem, and it is an object of the disclosure to provide a semiconductor laser device capable of emitting high-output laser light owing to improved efficiency in cooling an upper side of a semiconductor laser element.

Solution to Problem

A semiconductor laser device according to an aspect of the present disclosure includes a first heat radiator having a first flow path and a second flow path inside to allow a flow of a refrigerant and a second heat radiator put in contact with an upper surface of the first heat radiator. The first flow path and the second flow path are independent of each other. The second heat radiator includes an insulating member that internally has a third flow path communicating with the first flow path. The semiconductor laser device further includes a lower electrode block disposed on a portion of an upper surface of the second heat radiator, a submount disposed on a remainder of the upper surface of the second heat radiator, a semiconductor laser element disposed on an upper surface of the submount, and an upper electrode block disposed such that the submount and the semiconductor laser element are clamped between the upper electrode block and the second heat radiator. The submount is made of a conductive material and is electrically connected with the lower electrode block. The semiconductor laser element is electrically connected with the submount and the lower electrode block. The upper electrode block is electrically insulated from the lower electrode block by an insulating layer capable of heat transfer while being electrically connected with the semiconductor laser element. The second flow path is formed below a zone for the disposition of the lower electrode block.

Advantageous Effect of Invention

The semiconductor laser device according to the aspect of the present disclosure is able to efficiently cool both an upper surface and a lower surface of the semiconductor laser element. This technique allows the accomplishment of a high-output semiconductor laser device.

DESCRIPTION OF EMBODIMENTS

Exemplary embodiments of the present disclosure will be described in detail below with reference to the drawings. The following description of preferred exemplary embodiments is merely illustrative in nature and is in no way intended to limit the scope of the present invention and its application or uses.

Exemplary Embodiment

Configuration and Operation of Semiconductor Laser Device 1

Figure 1:
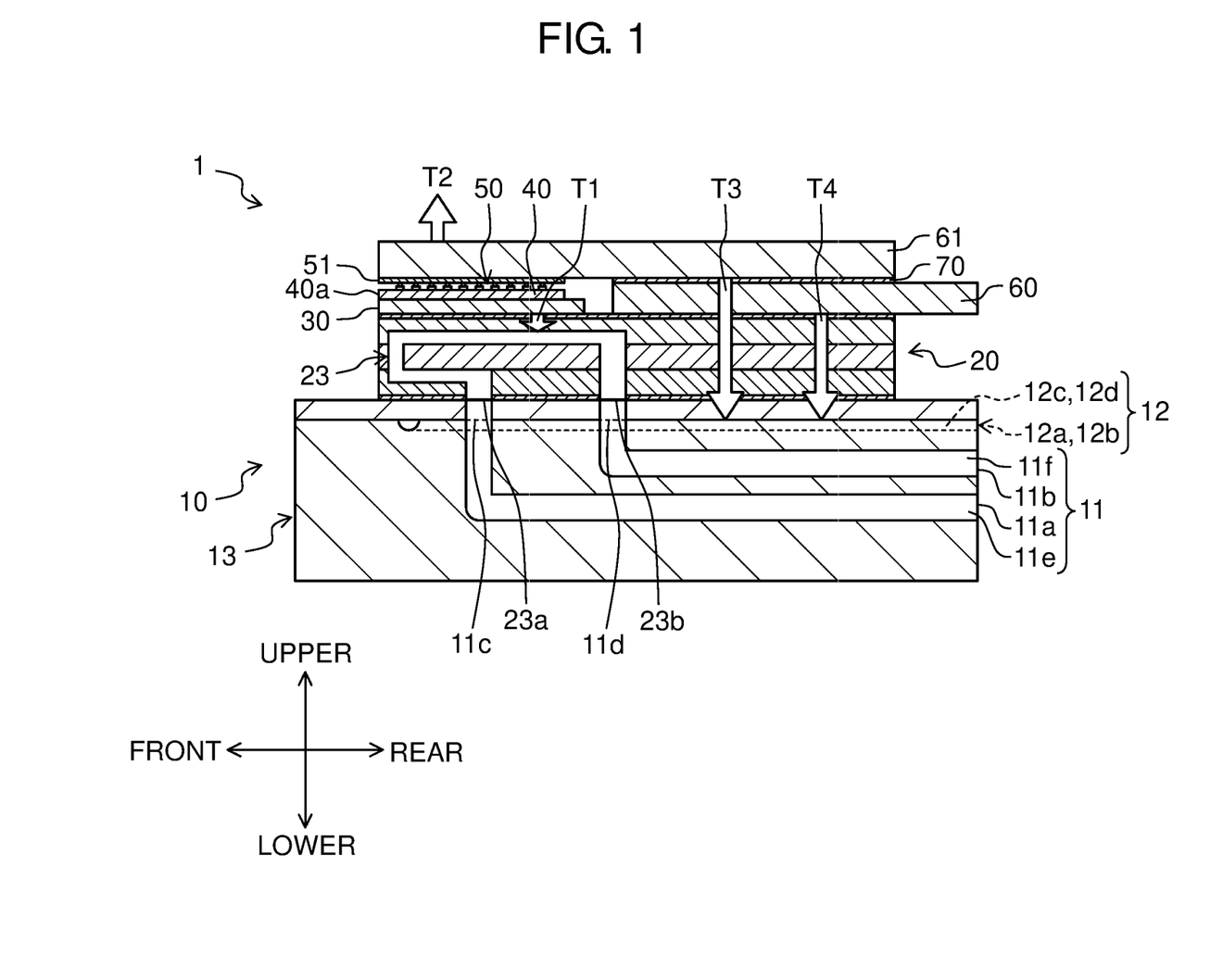
FIG. 1 is a cross-sectional view showing a configuration of a semiconductor laser device according to an exemplary embodiment of the present disclosure.

FIG. 1 is a cross-sectional view showing a configuration of a semiconductor laser device according to the present exemplary embodiment. For explanatory convenience, illustration or description of some parts will be omitted. In the following description, a side of semiconductor laser device 1 on which water-cooling jacket 10 is disposed may be referred to as "lower", whereas a side on which upper electrode block 61 is disposed may be referred to as "upper". A side of heat sink 20 on which semiconductor laser element 40 is disposed may be referred to as "front", whereas a side on which lower electrode block 60 is disposed may be referred to as "rear". As shown in FIG. 1, semiconductor laser device 1 includes, in the order from bottom, water-cooling jacket 10 (a first heat radiator), heat sink 20 (a second heat radiator), submount 30, semiconductor laser element 40, and upper electrode block 61. Semiconductor laser device 1 also includes lower electrode block 60 and insulating layer 70. The lower electrode block is disposed across a zone of an upper surface of heat sink 20 apart from another zone of the upper surface for submount 30. Lower electrode block 60 and upper electrode block 61 have respective parts that are stacked with insulating layer 70 interposed therebetween in a vertical direction. The components of semiconductor laser device 1 will be described below.

Figure 2:
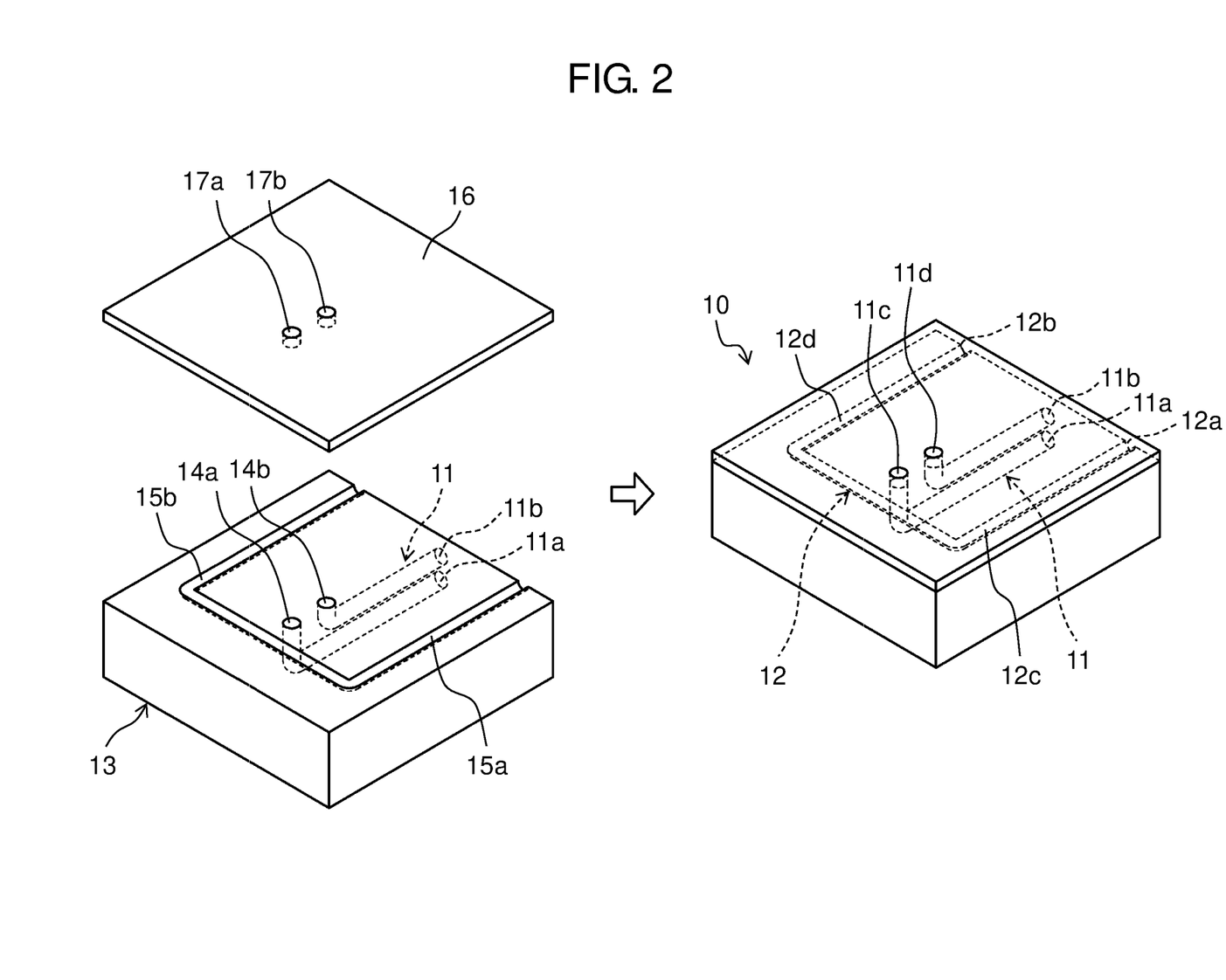
FIG. 2 is a drawing illustrating a method for producing a water-cooling jacket.

As shown in FIG. 2, water-cooling jacket 10 (the first heat radiator) includes metal block 13 (hereinafter sometimes referred to as a copper block) made of copper as a base component and has flow path 11 (a first flow path) and flow path 12 (a second flow path) inside to allow cooling water (not shown) to pass through. A side surface of metal block 13 has inlet 11a and outlet 11b for cooling water in flow path 11, as well as inlet 12a and outlet 12b for cooling water in flow path 12. In other words, flow path 11 and flow path 12 are formed independently of each other. Cooling water passing through an interior of each flow path is supplied exclusively from a chiller (not shown) or another cooling device. As shown in FIG. 1, an upper surface of water-cooling jacket 10 has openings 11c, 11d through which flow path 11 (the first flow path) communicates with flow path 23 (a third flow path) formed inside heat sink 20. A material of which metal block 13 is made is not particularly limited to copper. Another metallic material or an insulating material may be used with proviso that the material has high thermal conductivity, resistance to pressure put during passing of cooling water, and high corrosion resistance.

Figure 3:
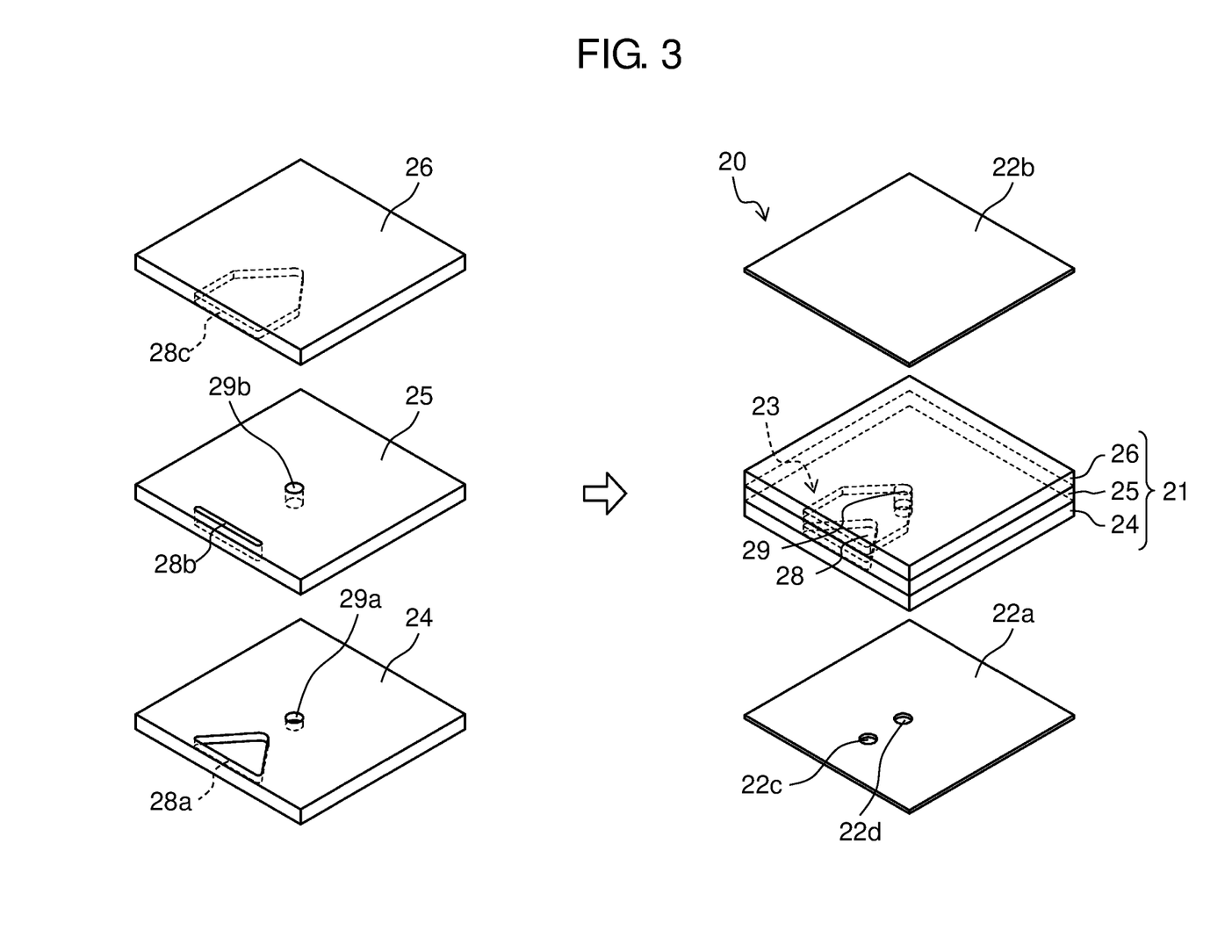
FIG. 3 is a drawing illustrating a method for producing a heat sink.

As shown in FIG. 3, heat sink 20 (the second heat radiator) has a ceramic board or a heat-resistant resin sheet as a base material and includes insulating member 21 containing aluminum nitride and copper layers 22a, 22b that are electrically conducting layers disposed on upper and lower surfaces of the insulating member. As described later, insulating member 21 includes a plurality of insulating plates 24 to 26 arranged in a stack. Copper layer 22a disposed on the lower surface of insulating member 21 has a function of thermally and mechanically combining water-cooling jacket 10 with heat sink 20. Copper layer 22b disposed on the upper surface of insulating member 21 has a function of thermally and mechanically combining submount 30 and lower electrode block 60 disposed on the upper surface of heat sink 20 with heat sink 20. Copper layer 22b also has a function of electrically connecting submount 30 with lower electrode block 60. Copper layers 22a, 22b may be replaced with layers made of another conductive material. Copper layers 22a, 22b may be replaced with layers made of an insulating material, with proviso that the semiconductor laser device includes another component to electrically connect submount 30 with lower electrode block 60. However, in this case, it is preferred that the insulating material be a material with high thermal conductivity, such as aluminum nitride.

As shown in FIGS. 4A to 4G, heat sink 20 has flow path 23 (the third flow path) internally. Flow path 23 is formed below disposition zone S1 (see FIG. 4A) for submount 30 on which semiconductor laser element 40 is placed. Flow path 23 has openings 23a, 23b (see FIG. 1) to communicate with flow path 11 in water-cooling jacket 10. Heat sink 20 possesses high thermal conductivity because insulating member 21 contains aluminum nitride. However, a constituent of the insulating member is not limited to this substance. A material of which insulating member 21 is made may be another substance, with proviso that the substance possesses an insulating property and high thermal conductivity and has a thermal expansion coefficient close to that of semiconductor laser element 40 and high corrosion resistance. For instance, the material is preferably a substance that has thermal conductivity higher than that of semiconductor laser element 40.

Submount 30 is, for example, made of a conductive material such as copper-tungsten (Cu:W) and is disposed across zone 51 that is a front part of the upper surface of heat sink 20 (a remainder of the upper surface of heat sink 20). As described above, submount 30 is joined to heat sink 20 through copper layer 22b and is electrically connected with lower electrode block 60. A gold-tin (Au—Sn) layer (not shown) is formed on an upper surface of submount 30 by a vapor phase growth method such as vapor deposition, or soldering. A lower electrode (not shown) of semiconductor laser element 40 and submount 30 are joined to each other through the gold-tin layer and are thereby electrically connected.

The material for submount 30 is not particularly limited to copper-tungsten. The material for submount 30 may be another substance that has electrical conductivity, high thermal conductivity, and a thermal expansion coefficient that is adjusted such that strain on semiconductor laser element 40 after joining is small. For instance, the substance may be an alloy of copper and molybdenum (Cu:Mo), or the submount may be a metal block that is made of a copper-based material and is coated with a thin diamond film. The gold-tin layer is not strictly necessary and may be replaced with a layer made of a material having electrical conductivity and high thermal conductivity. Semiconductor laser element 40 may be directly joined to submount 30 without the gold-tin layer.

Semiconductor laser element 40 is a semiconductor laser element of an edge-emitting type. Semiconductor laser element 40 includes the lower electrode on a lower surface and an upper electrode on an upper surface (all not shown). The lower electrode is joined to submount 30 through the gold-tin layer (not shown) on submount 30 and is electrically connected with submount 30. As described above, the lower electrode of semiconductor laser element 40 may be in direct contact with the upper surface of submount 30. A plurality of bumps 50 is disposed on an upper surface of the upper electrode. A resonator (not shown) of semiconductor laser element 40 is formed so as to extend in a front-rear direction. A front surface of semiconductor laser element 40 is equivalent to laser emitting edge 40a. Semiconductor laser element 40 is disposed over submount 30 such that laser emitting edge 40a and a front surface of submount 30 are substantially flush with each other. In the present exemplary embodiment, the lower electrode is a positive electrode (+) and the upper electrode is a negative electrode (−). However, these polarities may be reversed. Semiconductor laser element 40 may include a plurality of resonators. For instance, the semiconductor laser element may have a plurality of resonators that are disposed at intervals in a direction perpendicular to a drawing surface of FIG. 1.

Each bump 50 is, for example, a gold bump formed by melting a wire made of gold (Au). Since gold is softer than other metals, bumps 50 deform when semiconductor laser element 40 and upper electrode block 61 are connected together. This enables good electrical connection between semiconductor laser element 40 and upper electrode block 61 without causing substantial mechanical damage to both components. The material for bumps 50 may be any substance other than gold, with proviso that the substance has electrical conductivity and ensures electrical connection between the upper electrode of semiconductor laser element 40 and upper electrode block 61. As shown in FIG. 1, metal sheet 51 such as gold leaf may be inserted between bumps 50 and upper electrode block 61. Inserted metal sheet 51 provides an increase in area of contact between bumps 50 and metal sheet 51 and a decrease in contact resistance between bumps 50 and upper electrode block 61. Metal sheet 51 is not limited to gold leaf and may be a sheet made of another conductive material. A plurality of metal sheets 51 may be inserted between bumps 50 and upper electrode block 61. Metal sheet 51 may not be inserted with proviso that electrical connection between bumps 50 and upper electrode block 61 is satisfactorily good.

Lower electrode block 60 is, for example, a plate-shaped conductive component made of copper. Lower electrode block 60 is disposed across zone S2 that is a rear part of the upper surface of heat sink 20 (a portion of the upper surface of heat sink 20, see FIG. 4B) so as to be separated from submount 30 and semiconductor laser element 40. A lower surface of lower electrode block 60 is partly joined to heat sink 20 through copper layer 22b of heat sink 20. Insulating layer 70 is disposed on a part of an upper surface of lower electrode block 60.

Upper electrode block 61 is, for example, a plate-shaped conductive component made of copper. Upper electrode block 61 is disposed such that semiconductor laser element 40 and submount 30 are clamped between the upper electrode block and heat sink 20. Upper electrode block 61 is electrically connected with the upper electrode of semiconductor laser element 40 through bumps 50 and metal sheet 51. Upper electrode block 61 and lower electrode block 60 are stacked in the vertical direction, with insulating layer 70 interposed therebetween. As described later, lower electrode block 60 and upper electrode block 61 each double as a heat radiator to radiate heat generated from semiconductor laser element 40 to a surrounding atmosphere or heat sink 20. The material of which lower and upper electrode blocks 60 and 61 are made is not particularly limited to copper and may be another metallic material or a conductive material.

Insulating layer 70 is, for example, a heat-resistant resin sheet containing ceramic powder of aluminum nitride. Insulating layer 70 is disposed such that a lower surface and an upper surface of the insulating layer are in contact with lower electrode block 60 and upper electrode block 61, respectively. Insulating layer 70 has a function of electrically insulating lower electrode block 60 and upper electrode block 61 from each other, as well as a function of combining lower and upper electrode blocks 60 and 61 together so as to enable the transfer of heat between the two blocks. The material of which insulating layer 70 is made is not particularly limited to the one described above. Preferably, the material may be a substance having high thermal conductivity. For instance, the material is preferably a substance that has thermal conductivity higher than that of semiconductor laser element 40.

Semiconductor laser device 1 configured as described above operates as described below.

First, a predetermined voltage is applied between lower electrode block 60 and upper electrode block 61 while cooling water is flowing through flow paths 11, 12 of water-cooling jacket 10 and flow path 23 of heat sink 20. Then, a current starts flowing between the lower and the upper electrodes of semiconductor laser element 40 through copper layer 22b of heat sink 20, submount 30, bumps 50, and metal sheet 51. When the current exceeds an oscillation threshold current for semiconductor laser element 40, laser oscillation occurs in the resonator to emit laser light forward from laser emitting edge 40a.

Discharge of Heat from Semiconductor Laser Device 1

A flow of cooling water (a refrigerant) in semiconductor laser device 1 will now be described.

Cooling water supplied into flow path 11 from inlet 11a, which is formed in a rear surface of water-cooling jacket 10, flows forward inside parallel portion 11e, a lower portion of flow path 11 extending substantially parallel to the upper surface of water-cooling jacket 10. Then, the cooling water flows upward from a place below zone S1, on which submount 30 is disposed, and is supplied into flow path 23, which communicates with flow path 11 through opening 11c, inside heat sink 20. The cooling water flows upward inside flow path 23 toward laser emitting edge 40a of semiconductor laser element 40 and turns rearward at a place in a vicinity of the upper surface of insulating member 21. The cooling water flows so as to turn downward at a place in a vicinity of a front surface of lower electrode block 60 and is supplied into flow path 11 through opening 11d. After flowing downward, the cooing water flows rearward inside parallel portion 11f, an upper portion of flow path 11 extending substantially parallel to the upper surface of water-cooling jacket 10, and is supplied from outlet 11b into one of the chillers (not shown) or another cooling device. Cooling water supplied into flow path 12 from inlet 12a, which is formed in the rear surface of water-cooling jacket 10, flows forward along parallel portion 12c, a portion of flow path 12 extending substantially parallel to the upper surface of water-cooling jacket 10, to a place below a vicinity of laser emitting edge 40a of semiconductor laser element 40. The cooling water turns at the place below the vicinity of laser emitting edge 40a toward a deep side of the drawing surface to flow along another portion of flow path 12. The cooling water then turns rearward at a predetermined place to flow into parallel portion 12d of flow path 12 and is supplied from outlet 12b into the other chiller (not shown) or another cooling device.

A direction in which parallel portions lie, 11f of flow path 11 and parallel portions 12c, 12d of flow path 12 extend is not particularly limited to the above-described direction. The parallel portions may have a part that is inclined at a predetermined angle relative to the upper surface of water-cooling jacket 10.

A route for the discharge of heat from semiconductor laser device 1 will now be described.

As shown in FIG. 1, heat generated from semiconductor laser element 40 is primarily discharged to an outside through four routes. First heat discharge route T1 is a route through which heat is discharged from a lower side of semiconductor laser element 40 via submount 30 and heat sink 20 to flow path 23 located below disposition zone S1 for submount 30. Second heat discharge route T2 is a route through which heat is discharged from upper electrode block 61 into the surrounding atmosphere. Third heat discharge route T3 is a route through which heat is discharged from upper electrode block 61, which is connected with an upper side of semiconductor laser element 40, to water-cooling jacket 10 via insulating layer 70, lower electrode block 60, and heat sink 20. Fourth heat discharge route T4 is a route through which heat is discharged to water-cooling jacket 10 via lower electrode block 60 and heat sink 20.

Heat that passes through first heat discharge route T1 is discharged from semiconductor laser device 1 to the outside by way of cooling water flowing through flow paths 11 and 23. Meanwhile, in a vicinity of upper electrode block 61, no flow path is formed that allows a flow of cooling water. As described above, in the conventional structure, heat flowing from semiconductor laser element 40 into upper electrode block 61 is discharged to the outside through second heat discharge route T2. However, an amount of the discharged heat is small and the heat readily accumulates inside upper electrode block 61. Against this backdrop, in the present exemplary embodiment, upper electrode block 61 and lower electrode block 60 have respective parts that are stacked, with highly heat conductive insulating layer 70 interposed therebetween, and the lower surface of lower electrode block 60 is partly put in contact with heat sink 20. Beneath disposition zone S2 of heat sink 20 for lower electrode block 60, flow path 12 is formed inside water-cooling jacket 10, and heat sink 20 is efficiently cooled by cooling water supplied independently of flow path 11. This configuration, as shown with third heat discharge route T3, allows heat that has generated from semiconductor laser element 40 and that has accumulated inside upper electrode block 61 to be discharged into heat sink 20 via insulating layer 70 and lower electrode block 60. Further, as described above, the heat is discharged to the outside of semiconductor laser device 1 by way of cooling water flowing through flow path 12. Similarly, heat passing through fourth heat discharge route T4 is discharged to the outside of semiconductor laser device 1 via heat sink 20 by way of cooling water flowing through flow path 12.

As described above, according to the present exemplary embodiment, upper electrode block 61 connected with the upper side of semiconductor laser element 40 is thermally joined to heat sink 20 and water-cooling jacket 10 via lower electrode block 60. Water-cooling jacket 10 includes two-line flow paths formed independently of each other. The flow paths are made up of flow path 11 used to primarily cool the lower side of semiconductor laser element 40, i.e., disposition zone S1 for submount 30 on heat sink 20, and flow path 12 used to primarily cool disposition zone S2 for lower electrode block 60 on heat sink 20. This configuration allows heat discharged from semiconductor laser element 40, especially heat accumulated inside upper electrode block 61 connected with the upper side of semiconductor laser element 40, to be efficiently discharged. This permits an increase in the amount of electricity flowing into semiconductor laser element 40 and thus an increase in power output from semiconductor laser device 1.

The flow of cooling water in flow path 11 is regulated as described above. This enables the supply of cooling water to the place below laser emitting edge 40a of semiconductor laser element 40 at a short distance. The vicinity of laser emitting edge 40a is an area where the amount of generated heat is largest in semiconductor laser device 1. Thus, in order to efficiently cool the area, the flow path for cooling water going from inlet 11a to the place below laser emitting edge 40a is preferably as short as possible.

Parallel portions 12c, 12d of flow path 12 shown in FIG. 1 are preferably disposed above parallel portions 11e, 11f of flow path 11, i.e., closer to heat sink 20, and are more preferably disposed above parallel portion 11f in particular. The cooling water inside flow path 23 is heated most, as described above, when passing through the place below laser emitting edge 40a. This causes a fall in cooling efficiency of heat sink 20 while the cooling water flows throughout the rest of the flow path including parallel portion 11f. Meanwhile, parallel portions 12c, 12d of flow path 12 disposed as described above enable a flow of non-heated cooling water supplied from inlet 12a to a position close to heat sink 20. The cooling water passing through flow path 12 cools lower electrode block 60 with improved efficiency and contributes to an increase in cooling efficiency of semiconductor laser device 1. This allows an increase in power output from semiconductor laser device 1.

Method for Producing Semiconductor Laser Device 1 and Components Thereof

FIG. 2 is a drawing illustrating a method for producing water-cooling jacket 10. As shown in FIG. 2, water-cooling jacket 10 is formed by bonding copper block 13 and copper plate 16 together. Copper block 13 has flow path 11 that includes inlet 11a and outlet 1ib for a refrigerant, as well as holes 14a, 14b and channels 15a, 15b. Holes 14a, 14b are equivalent to openings 1ic, 1id in water-cooling jacket 10, whereas channels 15a, 15b are equivalent to parallel portions 12c, 12d of flow path 12 in water-cooling jacket 10.

Copper plate 16 has through-holes 17a, 17b equivalent to openings 11c, 1id of flow path 11 in water-cooling jacket 10. Copper block 13 and copper plate 16 are bonded together such that hole 14a and through-hole 17a overlap each other and that hole 14b and through-hole 17b overlap each other. When these components are bonded together, flow path 12 that includes inlet 12a and outlet 12b for a refrigerant is formed. By adjusting a thickness of copper plate 16, parallel portions 12c, 12d can be positioned in a vicinity of the upper surface of water-cooling jacket 10. Copper block 13 and copper plate 16 are bonded together, for example, by brazing. However, the binding material is not particularly limited to this example and may be a thin metal leaf or another substance. Inlet 11a, 12a and outlet 1ib, 12b for the refrigerant may be each provided with a sealant such as an O-ring to prevent leakage of cooling water.

FIG. 3 is a drawing illustrating a method for producing heat sink 20. As shown in FIG. 3, heat sink 20 is formed by stacking and bonding insulating plates 24 to 26 and copper layers 22a, 22b together such that channel 28 and hole 29 are disposed at predetermined places.

Insulating plates 24 to 26 are ceramic boards made of aluminum nitride or heat-resistant resin sheets containing aluminum nitride. Insulating member 21 having flow path 23 inside is formed by bonding these insulating plates together such that channel 28a, channel 28b, and channel 28c formed respectively in these insulating plates overlap one another at corresponding places and that hole 29a and hole 29b overlap each other at corresponding places. Channel 28a formed in insulating plate 24 is disposed at a place corresponding to a place of opening 23a of flow path 23, and hole 29a is disposed at a place corresponding to a place of opening 23b.

Copper layers 22a, 22b are each made up of copper foil or a conductive resin sheet containing a predetermined quantity of copper powder. Copper layer 22a has through-holes 22c, 22d equivalent to openings 23a, 23b of flow path 23.

Insulating member 21, which is made up of insulating plates 24 to 26 stacked by the process described above, is bonded to copper layer 22a such that channel 28a in insulating plate 24 and through-hole 22c in copper layer 22a overlap each other and that hole 29a in insulating plate 24 and through-hole 22d in copper layer 22a overlap each other. Then, copper layer 22b is bonded to insulating member 21 to complete heat sink 20.

An order in which each of copper layers 22a, 22b is bonded to insulating member 21 may differ from the one described above. A material of which insulating plates 24 to 26 is made is not particularly limited to the one described above and may be another insulating material. The material of which insulating plates 24 to 26 is made may be any substance, with proviso that the substance possesses high thermal conductivity, a thermal expansion coefficient close to that of semiconductor laser element 40, and high corrosion resistance. For instance, the material is preferably a substance that has thermal conductivity higher than that of semiconductor laser element 40.

Insulating plates 24 to 26 are bonded together and insulating member 21 and copper layers 22a, 22b are bonded together, for example, by a binding material made of an organic material. However, a substance of which the binding material is made is not particularly limited to this example. A joint between each of channel 28a and hole 29a of insulating plate 24 and each of through-holes 22c, 22d of copper layer 22a corresponding to openings 23a, 23b of flow path 23 may be provided with a sealant such as an O-ring to prevent leakage of cooling water.

As described above, water-cooling jacket 10 is formed by stacking members that each have a part of flow paths 11, 12. This helps simplify processing of flow paths 11, 12. Similarly, heat sink 20 is formed by stacking members that each have a part of flow path 23. This helps simplify processing of flow path 23.

FIGS. 4A to 4G are drawings illustrating a method for producing semiconductor laser device 1.

Figure 4A:
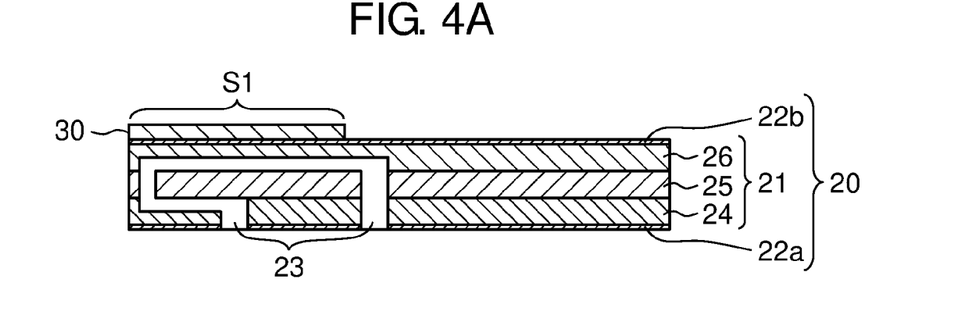
FIG. 4A is a drawing illustrating a step included in a method for producing the semiconductor laser device according to one aspect of the present disclosure.

Submount 30 is disposed across zone 51 on the upper surface of heat sink 20, which is formed by the process shown in FIG. 3, to join heat sink 20 and submount 30 together through copper layer 22b (FIG. 4A).

Figure 4B:
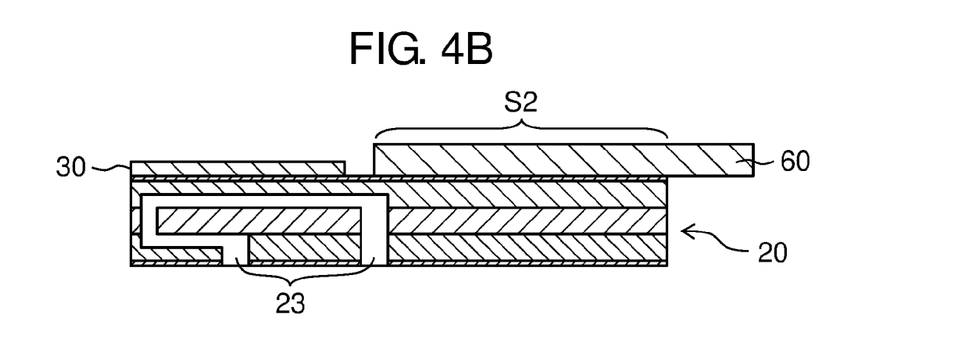
FIG. 4B is a drawing illustrating a step following the step in FIG. 4A.
Figure 4C:
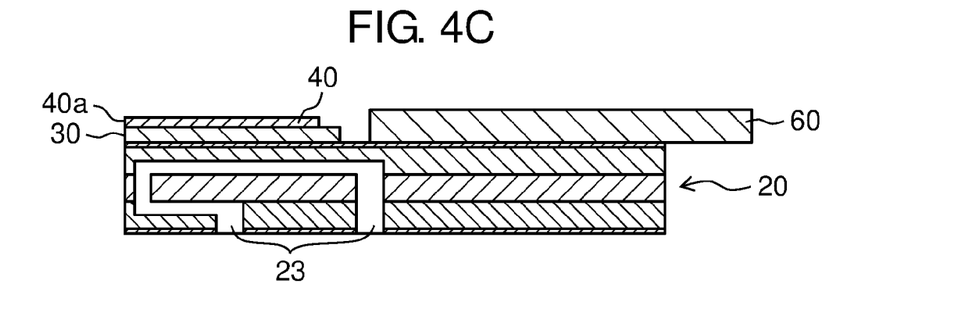
FIG. 4C is a drawing illustrating a step following the step in FIG. 4B.
Figure 4D:
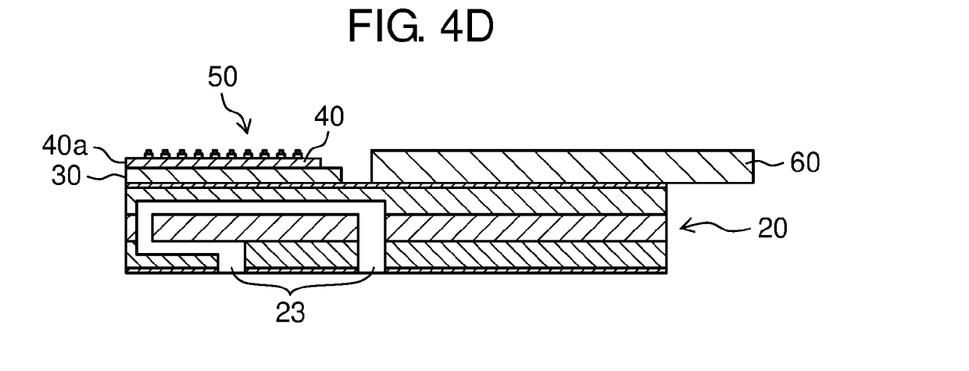
FIG. 4D is a drawing illustrating a step following the step in FIG. 4C.

Lower electrode block 60 is disposed across zone S2 on the upper surface of heat sink 20 to join heat sink 20 and lower electrode block 60 together through copper layer 22b (FIG. 4B). A gold-tin layer is formed on the upper surface of submount 30, and semiconductor laser element 40 is disposed such that the lower electrode is put in contact with the gold-tin layer to join submount 30 and semiconductor laser element 40 together (FIG. 4C). Bumps 50 are formed on the upper electrode of semiconductor laser element 40 (FIG. 4D).

A method for forming bumps 50 will now be described.

For instance, while ultrasonic waves are given, gold wire is joined to the upper electrode of semiconductor laser element 40. By applying a predetermined degree of tension to the gold wire while ultrasonic waves are given, the gold wire is broken with a tip joined to the upper electrode being left, and bump 50 with a pointed tip is formed. However, bumps 50 may be formed by any other method, for example, by transferring electrodes with pointed tips to the upper electrode.

Figure 4E:
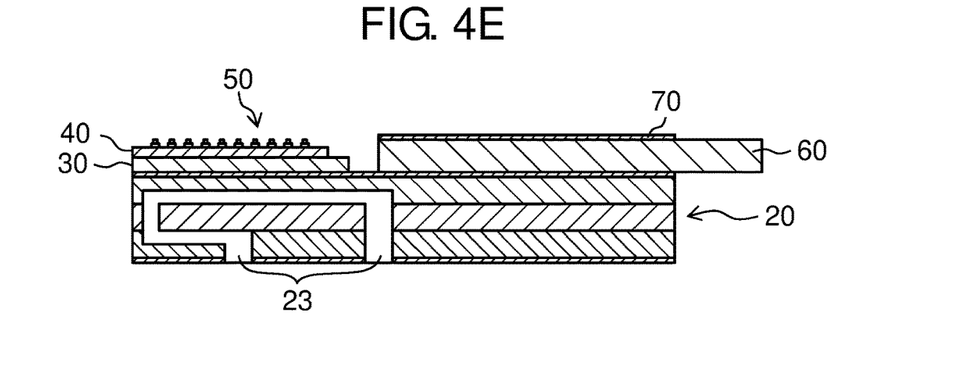
FIG. 4E is a drawing illustrating a step following the step in FIG. 4D.
Figure 4F:
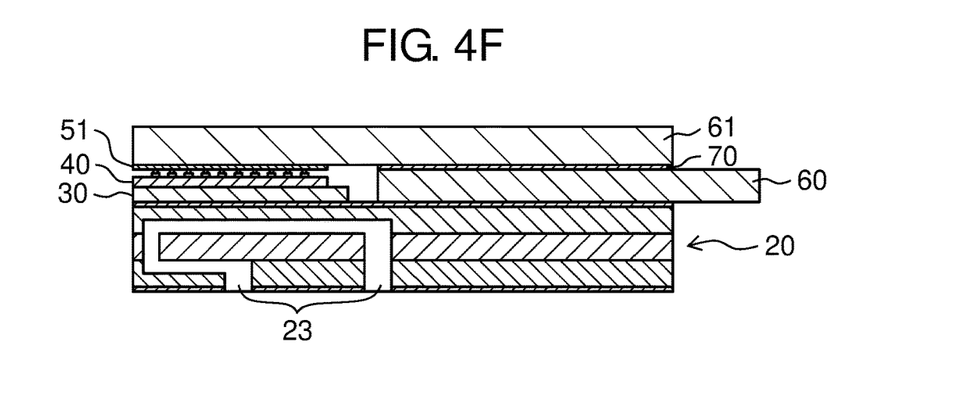
FIG. 4F is a drawing illustrating a step following the step in FIG. 4E.
Figure 4G:
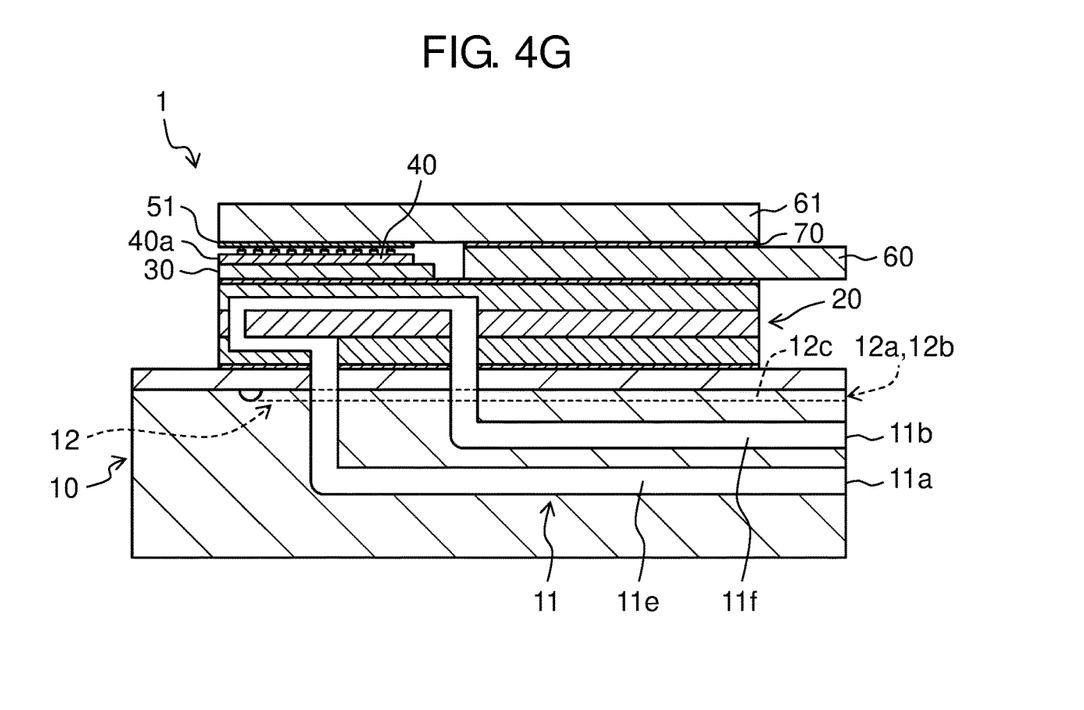
FIG. 4G is a drawing illustrating a step following the step in FIG. 4F.

Next, insulating layer 70 is disposed on the upper surface of lower electrode block 60 (FIG. 4E). If insulating layer 70 is a resin sheet, insulating layer 70 is bonded to lower electrode block 60 using, for example, a binding material made of an organic material. After metal sheet 51 is disposed on bumps 50 and an upper surface of semiconductor laser element 40, upper electrode block 61 is disposed over bumps 50 and semiconductor laser element 40 and on the upper surface of insulating layer 70. Upper electrode block 61 is joined to metal sheet 51 and bumps 50 and is fixed to insulating layer 70 (FIG. 4F). The upper electrode block is fixed to insulating layer 70 using, for example, a binding material made of an organic material.

Next, heat sink 20 is disposed on the upper surface of water-cooling jacket 10, which is formed by the process shown in FIG. 2. Water-cooling jacket 10 and heat sink 20 are connected together such that openings 11c, 11d formed in the upper surface of water-cooling jacket 10 and respective openings 23a, 23b formed in a lower surface of heat sink 20 overlap each other. When flow path 11 and flow path 23 communicate, semiconductor laser device 1 is completed (FIG. 4F). A joint between openings 11c, 23a and a joint between openings 11d, 23b may be each provided with a sealant such as an O-ring to prevent leakage of cooling water.

Effects and Others

As described above, in semiconductor laser device 1 according to the present exemplary embodiment, flow paths, 11, 23 and flow path 12 are formed independently of each other in water-cooling jacket 10 and heat sink 20. Flow paths, 11, 23 primarily cool semiconductor laser element 40, whereas flow path 12 primarily cools upper electrode block 61 connected to semiconductor laser element 40. Specifically, semiconductor laser device 1 includes water-cooling jacket 10 having flow path 11 and flow path 12 inside to allow a flow of a refrigerant and heat sink 20 put in contact with an upper surface of water-cooling jacket 10. Flow paths 11 and 12 are independent of each other. The heat sink includes insulating member 21 that internally has flow path 23 communicating with first flow path 11. The semiconductor laser device further includes lower electrode block 60 disposed on a portion of an upper surface of heat sink 20, submount 30 disposed on a remainder of the upper surface of heat sink 20, semiconductor laser element 40 disposed on an upper surface of submount 30, and upper electrode block 61 disposed such that submount 30 and semiconductor laser element 40 are clamped between the upper electrode block and heat sink 20. The submount is made of a conductive material and is electrically connected with lower electrode block 60. The semiconductor laser element is electrically connected with submount 30 and lower electrode block 60. The upper electrode block is electrically insulated from lower electrode block 60 by insulating layer 70 capable of heat transfer while being electrically connected with semiconductor laser element 40. Flow path 12 is formed below a zone for the disposition of lower electrode block 60.

This configuration enables upper electrode block 61 connected with an upper side of semiconductor laser element 40 to be thermally joined to lower electrode block 60 via insulating layer 70 capable of heat transfer, as well as to water-cooling jacket 10 and heat sink 20. Water-cooling jacket 10 includes two-line flow paths formed independently of each other, i.e., flow path 11 and flow path 12 that is configured to cool an area below the disposition zone for lower electrode block 60. This allows heat accumulated inside upper electrode block 61 to be efficiently discharged via lower electrode block 60. This permits an increase in the amount of electricity flowing into semiconductor laser element 40 and thus an increase in power output from semiconductor laser device 1.

Preferably, flow path 23 is formed below disposition zone S1 for submount 30.

This configuration allows heat accumulated in submount 30 and a lower side of semiconductor laser element 40 to be efficiently discharged by way of the refrigerant flowing through flow path 11 and flow path 23.

It is preferred that flow paths 11, 12 include respective parallel portions 11e, 11f, 12c, 12d extending substantially parallel to the upper surface of water-cooling jacket 10 and that parallel portions 12c, 12d of flow path 12 are disposed closer to heat sink 20 than parallel portions 11e, 11f of flow path 11 are.

This configuration enables cooling of lower electrode block 60 and upper electrode block 61 without being influenced by a rise in temperature of the refrigerant flowing through flow paths 11, 23 that primarily cool semiconductor laser element 40.

Preferably, water-cooling jacket 10 is formed by stacking a plurality of members 13, 16 that each have a part of flow paths 11, 12.

This configuration helps simplify processing of flow paths 11, 12 in water-cooling jacket 10. Preferably, heat sink 20 is formed by stacking a plurality of members 24, 25, 26 that each have a part of flow path 23.

This configuration helps simplify processing of flow path 23 in heat sink 20. Preferably, thermal conductivity of insulating member 21 and insulating layer 70 is higher than thermal conductivity of semiconductor laser element 40.

First Modification Example

Configuration of Semiconductor Laser Device 2

Figure 5:
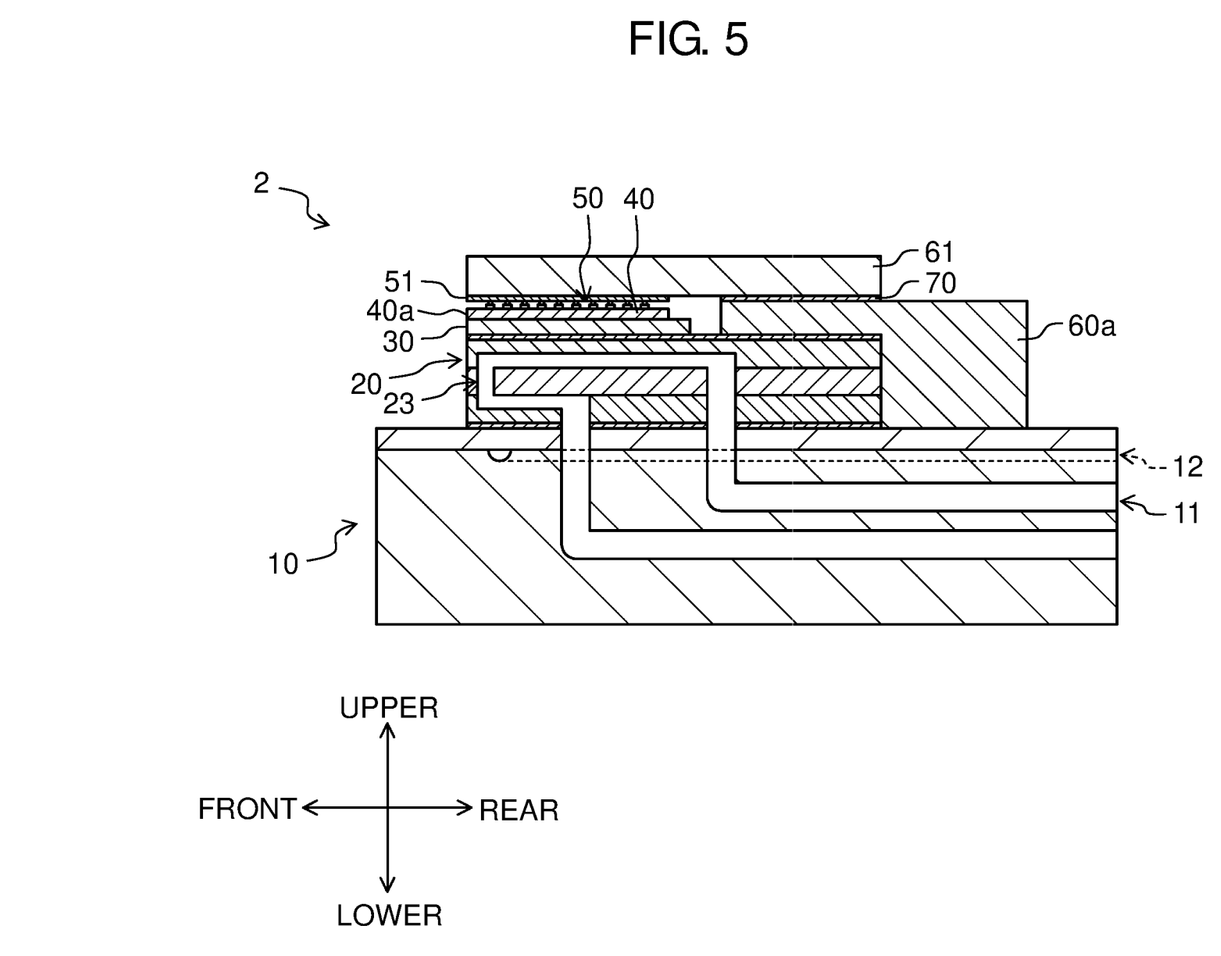
FIG. 5 is a cross-sectional view showing a configuration of a semiconductor laser device according to a first modification example.

FIG. 5 is a cross-sectional view showing a configuration of semiconductor laser device 2 according to a first modification example.

A difference in configuration between the exemplary embodiment and the present modification example exists in that lower electrode block 60a of the present modification example includes an extension extending downward along a rear surface of heat sink 20 and coming into contact with an upper surface of water-cooling jacket 10.

Lower electrode block 60a formed as shown in FIG. 5 provides a shortened distance from lower electrode block 60a to flow path 12, especially to parallel portions 12c, 12d, and enables cooling water flowing through flow path 12 to cool lower electrode block 60a with improved efficiency. This also contributes to improved efficiency in cooling upper electrode block 61 that is stacked over lower electrode block 60a with insulating layer 70 interposed therebetween. This configuration allows a further increase in power output from semiconductor laser device 1 of the exemplary embodiment. If semiconductor laser element 40 is a multi-emitter type element having several tens of resonators in particular, a high current ranging from 100 A to several hundred A flows between lower electrode block 60a and upper electrode block 61. In such a case, both lower electrode block 60a and upper electrode block 61 need to be satisfactorily cooled to reduce a rise in temperature of semiconductor laser element 40. Hence, the configuration shown in the present modification example is effective.

In the configuration shown in FIG. 5, lower electrode block 60a and water-cooling jacket 10 are in direct contact with each other and thus, although no illustration is given in the figure, an insulating layer may be formed on a side surface of submount 30 facing lower electrode block 60a to reinforce insulation between lower electrode block 60a and upper electrode block 61. An insulating layer (not shown) may be formed between the upper surface of water-cooling jacket 10 and a lower surface of lower electrode block 60a. A thickness of the insulating layer is appropriately selected within a range that does not greatly impede the discharge of heat form lower electrode block 60a. Obviously, it is preferred that the material of which the insulating layer is made be a substance that possesses high thermal conductivity and high corrosion resistance. For instance, the material is preferably a substance that has thermal conductivity higher than that of semiconductor laser element 40.

Effects and Others

As described above, it is preferred that lower electrode block 60a include an extension extending along a side surface of heat sink 20 and coming into contact with the upper surface of water-cooling jacket 10.

This configuration enables cooling water flowing through flow path 12 to directly cool lower electrode block 60a and thus contributes to improved efficiency in cooling lower electrode block 60a and upper electrode block 61.

Second Modification Example

Figure 6:
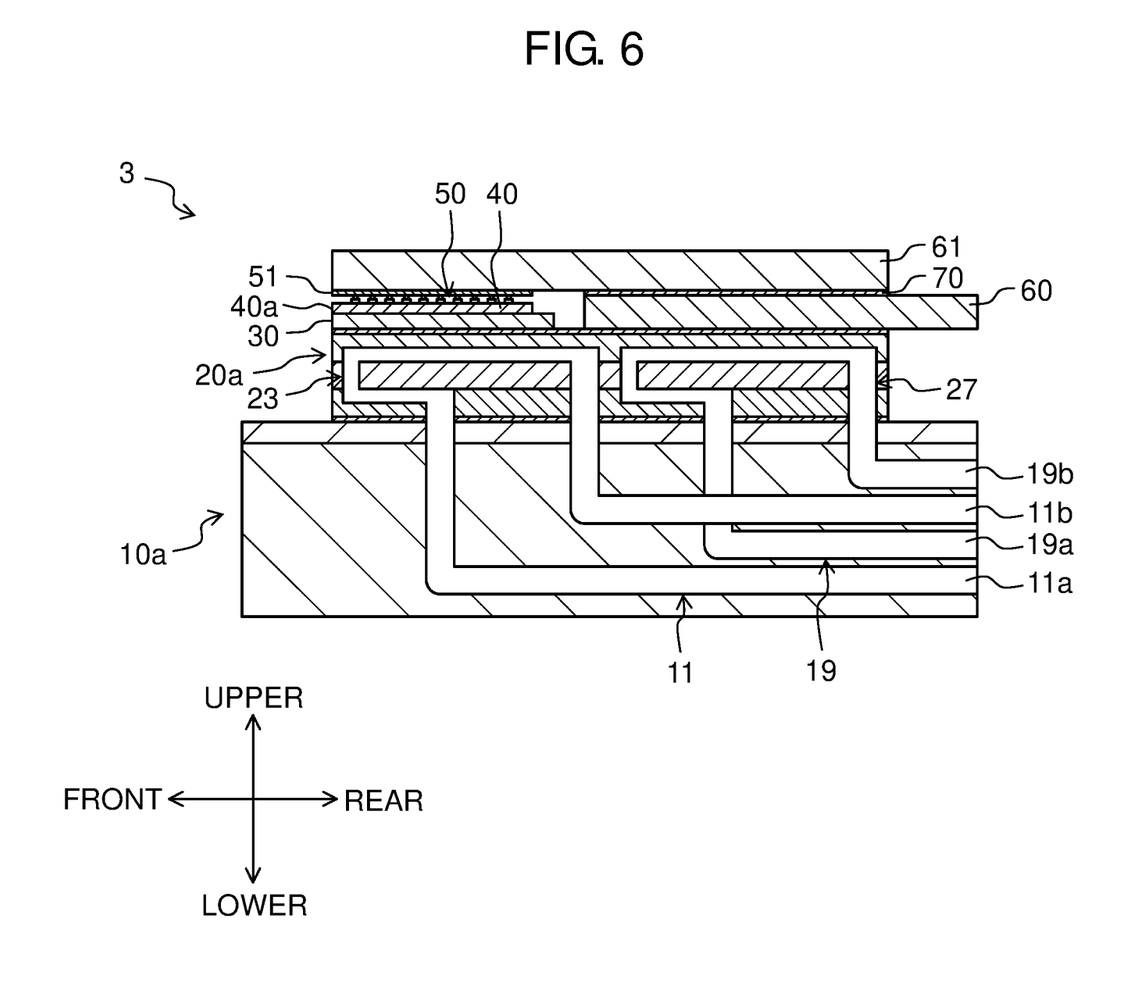
FIG. 6 is a cross-sectional view showing a configuration of a semiconductor laser device according to a second modification example.

FIG. 6 is a cross-sectional view showing a configuration of semiconductor laser device 3 according to a second modification example.

A difference in configuration between the exemplary embodiment and the present modification example exists in that an insulating member of heat sink 20a of the present modification example internally has flow path 27 (a fourth flow path) independent of flow path 23 and that flow path 27 and flow path 19 (a second flow path) inside water-cooling jacket 10a of the present modification example communicate with each other.

As shown in FIG. 6, flow path 27 is formed inside heat sink 20a and below disposition zone S2 for lower electrode block 60 and is designed to communicate with flow path 19 in water-cooling jacket 10a. This provides a shortened distance from lower electrode block 60 to flow path 27. This in turn enables cooling water flowing through flow paths 19, 27 to cool lower electrode block 60 with improved efficiency and thus contributes to improved efficiency in cooling upper electrode block 61 that is stacked over lower electrode block 60 with insulating layer 70 interposed therebetween. This configuration allows a further increase in power output from semiconductor laser device 1 of the exemplary embodiment. If semiconductor laser element 40 is a multi-emitter type element having several tens of resonators in the same way as the first modification example, the configuration shown in the present modification example is effective in reducing a rise in temperature of semiconductor laser element 40.

Water-cooling jacket 10a and heat sink 20a in semiconductor laser device 2 can be formed by a method similar to the method shown in the exemplary embodiment. In other words, water-cooling jacket 10a is formed by stacking members that each have a part of flow paths 11, 19. This helps simplify processing of flow paths 11, 19. Similarly, heat sink 20a is formed by stacking members that each have a part of flow paths 23, 27. This helps simplify processing of flow paths 23, 27.

Effects and Others

As described above, it is preferred that the insulating member of heat sink 20a internally have flow path 27 communicating with flow path 19 and being independent of flow path 23.

Preferably, flow path 27 is formed below disposition zone S2 for lower electrode block 60. This configuration provides a shortened distance form lower electrode block 60 to flow path 27 communicating with flow path 19 and thus contributes to improved efficiency in cooling lower electrode block 60 and upper electrode block 61.

Other Exemplary Embodiments

In semiconductor laser device 3 shown in FIG. 6, lower electrode block 60 may be configured to be similar in form and disposition to the lower electrode block of semiconductor laser device 2 shown in FIG. 5. This configuration enables semiconductor laser device 1 of the exemplary embodiment to provide further improved cooling efficiency.

In the exemplary embodiments including the first and the second modification examples described above, inlet 11a and outlet 11b of flow path 11 for the refrigerant are formed in the rear surface of water-cooling jacket 10. The inlet and the outlet may be formed in a surface other than the rear surface. However, if inlet 11a and outlet 11b for the refrigerant are formed in a front surface of the water-cooling jacket on a side identical to the side from which laser light is emitted, a place for the installation of cooling water pipes (not shown) connected to the inlet and the outlet may be subject to constraints. This also applies to a disposition of inlets 12a, 19a and outlets 12b, 19b of flow paths 12, 19 for the refrigerant.

In the examples shown above, cooling water is used as the refrigerant. However, a refrigerant, such as an antifreeze solution, other than water may be used. If semiconductor laser element 40 is cooled excessively, for example, to a few ° C., condensation can form on laser emitting edge 40a or another part. If such condensation occurs, laser oscillation could not take place or semiconductor laser device 1 might be damaged in some cases. If the temperature of semiconductor laser element 40 greatly exceeds 60° C., optical output characteristics may change and output cannot reach a desired level in some cases. Consequently, it is preferred that a type of the refrigerant be selected or temperature of the refrigerant be controlled such that semiconductor laser element 40 in operation is kept at temperatures approximately from 10° C. to 40° C.

INDUSTRIAL APPLICABILITY

A semiconductor laser device according to the present disclosure is able to efficiently cool both an upper surface and a lower surface of a semiconductor laser element. This technique allows the accomplishment of a semiconductor laser device with higher output and thus can be usefully applied to industrial equipment such as laser machining devices.

REFERENCE MARKS IN THE DRAWINGS 1 to 3: semiconductor laser device
10, 10a: water-cooling jacket
11: flow path (first flow path)
11a, 12a, 19a: inlet for refrigerant
11b, 12b, 19b: outlet for refrigerant
11e, 11f: parallel portion of flow path 11
12, 19: flow path (second flow path)
12c, 12d: parallel portion of flow path 12
13: metal block (copper block)
16: copper plate
20, 20a: heat sink
21: insulating member
23: flow path (third flow path)
24 to 26: insulating plate
27: flow path (fourth flow path)
30: submount
40: semiconductor laser element
50: bump
51: metal sheet
60, 60a: lower electrode block
61: upper electrode block
70: insulating layer
S1: disposition zone for submount 30
S2: disposition zone for lower electrode block 60, 60a

The invention claimed is:

1. A semiconductor laser device comprising:
a first heat radiator having a first flow path and a second flow path inside to allow a flow of a refrigerant, the first flow path and the second flow path being independent of each other;
a second heat radiator put in contact with an upper surface of the first heat radiator, the second heat radiator including an insulating member that internally has a third flow path communicating with the first flow path;
a lower electrode block disposed on a portion of an upper surface of the second heat radiator;
a submount disposed on a remainder of the upper surface of the second heat radiator, the submount being made of a conductive material and being electrically connected with the lower electrode block;
a semiconductor laser element disposed on an upper surface of the submount, the semiconductor laser element being electrically connected with the submount and the lower electrode block; and
an upper electrode block disposed in such a way that the submount and the semiconductor laser element are clamped between the upper electrode block and the second heat radiator, the upper electrode block being electrically insulated from the lower electrode block by an insulating layer capable of heat transfer while being electrically connected with the semiconductor laser element,
wherein the second flow path is formed below a zone for the disposition of the lower electrode block.

2. The semiconductor laser device according to claim 1, wherein the third flow path is formed below a zone for the disposition of the submount.

3. The semiconductor laser device according to claim 1, wherein the lower electrode block includes an extension extending along a side surface of the second heat radiator and coming into contact with the upper surface of the first heat radiator.

4. The semiconductor laser device according to claim 1, wherein
the first and the second flow paths each comprise a parallel portion extending substantially parallel to the upper surface of the first heat radiator, and the parallel portion of the second flow path is disposed closer to the second heat radiator than the parallel portion of the first flow path is.

5. The semiconductor laser device according to claim 1, wherein the insulating member of the second heat radiator internally has a fourth flow path communicating with the second flow path and being independent of the third flow path.

6. The semiconductor laser device according to claim 5, wherein the fourth flow path is formed below the zone for the disposition of the lower electrode block.

7. The semiconductor laser device according to claim 1, wherein the first heat radiator is formed by stacking a plurality of members that each have a part of the first and the second flow paths.

8. The semiconductor laser device according to claim 1, wherein the second heat radiator is formed by stacking a plurality of members that each have a part of the third flow path.

9. The semiconductor laser device according to claim 1, wherein thermal conductivity of the insulating member and the insulating layer is higher than thermal conductivity of the semiconductor laser element.

\* \* \* \* \*